U.S. Patent No.: US 8,158,529 B2
Date of Patent: Apr. 17, 2012

(12) United States Patent
Kim

(54) METHOD FOR FORMING ACTIVE PILLAR OF VERTICAL CHANNEL TRANSISTOR

(75) Inventor: Myung-Ok Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 350 days.

(21) Appl. No.: 12/492,559

(22) Filed: Jun. 26, 2009

(65) Prior Publication Data

US 2010/0055917 A1    Mar. 4, 2010

(30) Foreign Application Priority Data

Sep. 2, 2008 (KR) .......... 10-2008-0086309

(51) Int. Cl.
*H01L 21/302* (2006.01)

(52) U.S. Cl. ......... 438/733; 438/700; 438/734; 438/738

(58) Field of Classification Search .......... 438/700, 438/706, 710, 712, 717, 723, 478, 498, 714, 438/733, 734, 738; 216/67, 72
See application file for complete search history.

(56) References Cited

U.S. PATENT DOCUMENTS

| | | | | |
|---|---|---|---|---|
| 5,976,769 | A * | 11/1999 | Chapman | 430/316 |
| 2006/0183282 | A1 | 8/2006 | Raghuram et al. | |
| 2006/0194439 | A1 * | 8/2006 | Sadjadi et al. | 438/725 |
| 2007/0243714 | A1 * | 10/2007 | Shin et al. | 438/706 |
| 2009/0035944 | A1 * | 2/2009 | Chiang et al. | 438/703 |

FOREIGN PATENT DOCUMENTS

| | | |
|---|---|---|
| JP | 06-216149 | 8/1994 |
| KR | 1020040006770 | 1/2004 |
| KR | 10-0759839 | 9/2007 |

OTHER PUBLICATIONS

Notice of Preliminary Rejection issued from Korean Intellectual Property Office on Aug. 24, 2010.
Notice of Allowance issued from Korean Intellectual Property Office on Feb. 23, 2011.

* cited by examiner

*Primary Examiner* — Lan Vinh
(74) *Attorney, Agent, or Firm* — IP & T Group LLP

(57) ABSTRACT

A method for forming an active pillar of a vertical channel transistor includes forming a hard mask pattern on a substrate, etching vertically the substrate using the hard mask pattern as an etch barrier to form an active pillar, and etching horizontally to remove by-product remaining on the exposed substrate, the hard mask pattern and the active pillar and at the same time to reduce line width of the hard mask pattern and the active pillar, wherein a unit cycle in which the vertical etching and the horizontal etching are each performed subsequently once, respectively, is performed repeatedly at least two times or more. According to the present invention, an active pillar having vertical profiles on its sidewalls and having height and line width (or diameter) required in a highly integrated vertical channel transistor can be provided.

18 Claims, 5 Drawing Sheets

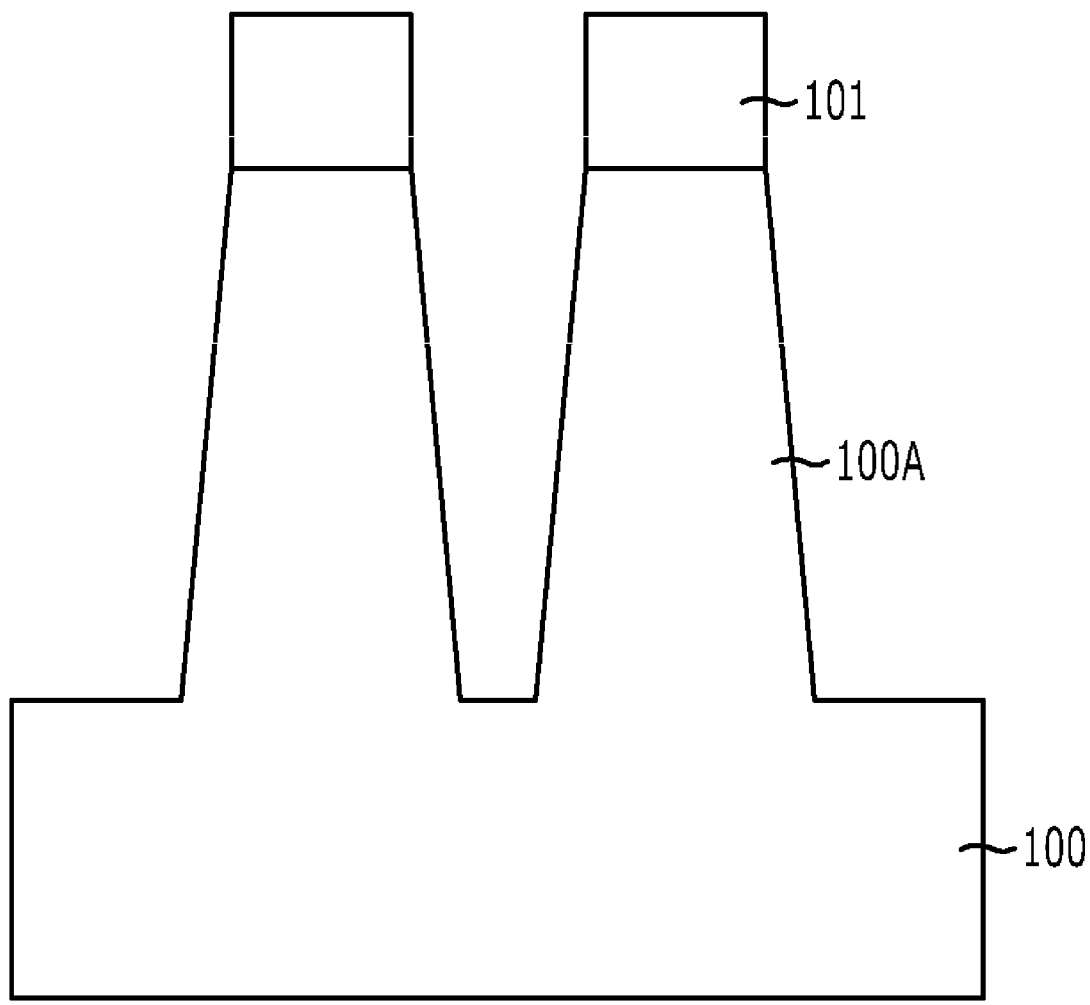

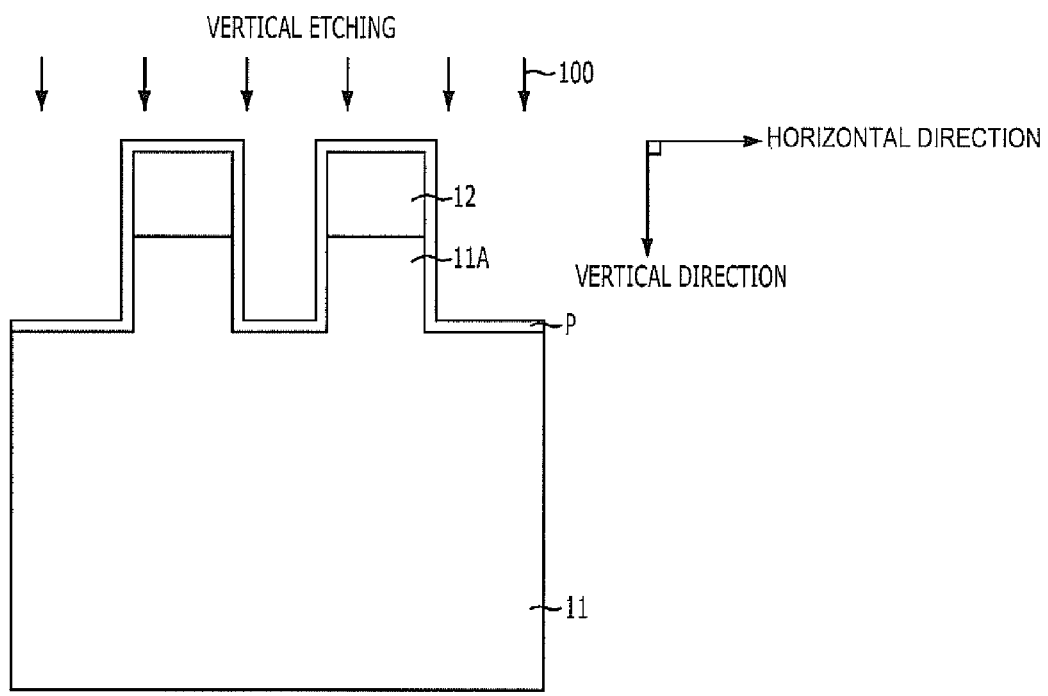
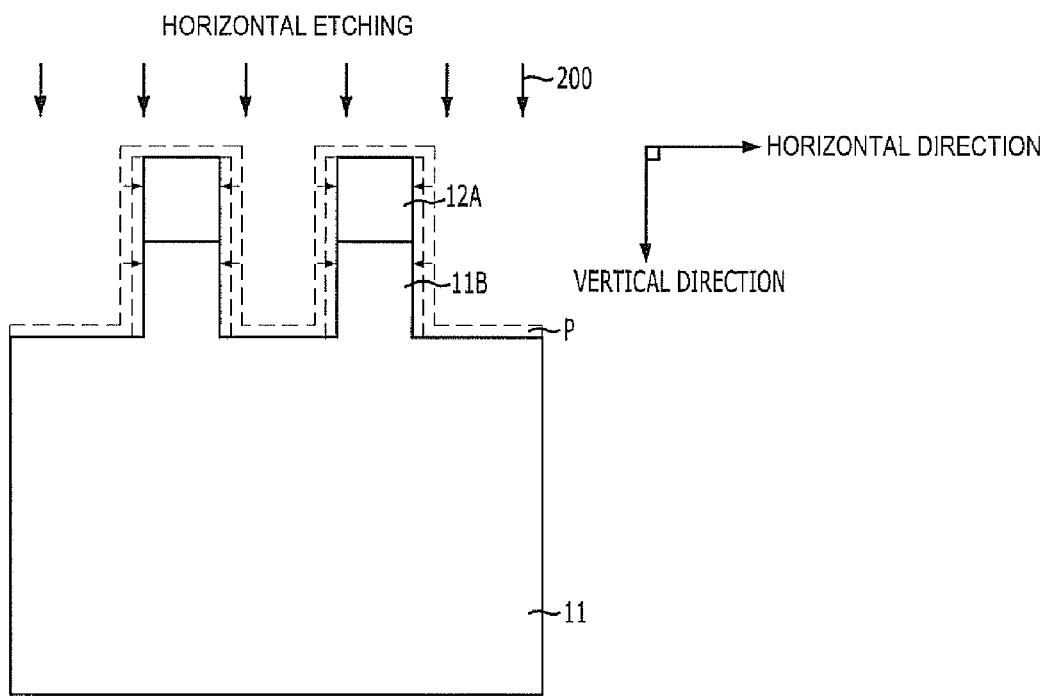

[A]  [B]

[A]  [B]

[A]  [B]

[A]  [B]

METHOD FOR FORMING ACTIVE PILLAR OF VERTICAL CHANNEL TRANSISTOR

CROSS-REFERENCE TO RELATED APPLICATIONS

The present invention claims priority of Korean patent application number 10-2008-0086309 filed on Sep. 2, 2008, respectively, the disclosure of which is incorporated herein by reference in its entirety.

BACKGROUND OF THE INVENTION

The present invention relates to a technology of fabricating a semiconductor device, and more particularly, to a method for forming active pillars of a vertical channel transistor.

Recently, a semiconductor memory device having $4F^2$ (F: minimum feature size) has been demanded as the size of a semiconductor device decreases, and thus a semiconductor device provided with a vertical channel transistor has been proposed. The vertical channel transistor is configured such that a surround type gate surrounding a periphery of an active pillar extending vertically on a substrate is formed and then a drain region and a source region are formed on upper end and lower end of the active pillar, respectively, around the gate, thereby forming vertically a channel.

FIG. 1 is a cross-sectional view of active pillars of a vertical channel transistor according to prior art.

According to a method for forming an active pillar of a vertical channel transistor according to the prior art, a hard mask pattern 101 is formed on a substrate 100 using a photolithography process and then the substrate 100 is etched using the hard mask pattern 101 as an etch barrier to form an active pillar 100A.

Here, a line width (or diameter) of the active pillar 100A has to be reduced according to the prior art according to design requirements. However, limitation exists on reducing the line width of the active pillar 100A due to a defined photolithography process.

Additionally, sidewalls of the active pillar 100A may be formed as vertical profiles. However, the sidewalls of the active pillar 100A may be formed to be inclined since by-product generated while the active pillar 100A is formed such as polymer may remain on surfaces of the hard mask pattern 101 and the active pillar 100A. This is because the by-product acts as an etch barrier. As aforementioned, when the sidewalls of the active pillar 100a are inclined, a process margin in a subsequent process such as a surround type gate forming process decreases, thereby increasing difficulties in the subsequent process.

SUMMARY OF THE INVENTION

Embodiments of the present invention are directed to providing a method for forming active pillars that can overcome a limitation in a photolithography process.

Embodiments of the present invention are also directed to providing a method for forming active pillars that can prevent sidewalls of the active pillar from being inclined due to by-product generated during a process of forming active pillars.

In accordance with an aspect of the present invention, there is provided a method for forming an active pillar of vertical channel transistor, including: forming a hard mask pattern on a substrate; etching vertically the substrate using the hard mask pattern as an etch barrier to form an active pillar; and etching horizontally to remove by-product remaining on the exposed substrate, the hard mask pattern and the active pillar and at the same time to reduce line width of the hard mask pattern and the active pillar, wherein a unit cycle in which the vertical etching and the horizontal etching are each performed subsequently once, respectively, is performed repeatedly at least two times or more.

The vertical etching may be performed anisotropically and the horizontal etching may be performed isotropically.

In accordance with an aspect of the present invention, there is provided a method for forming a pillar of a vertical channel transistor, including: forming a mask pattern over a substrate; vertically etching the substrate using the mask pattern as an etch barrier to form a pillar; horizontally etching the vertically etched substrate to horizontally remove by-product remaining on the exposed substrate, the mask pattern and the pillar and reduce horizontal width of the mask pattern and the pillar; and repeating a cycle of the vertical etching and horizontal etching at least once after completing a first cycle of the vertical etching and horizontal etching.

BRIEF DESCRIPTION OF THE DRAWINGS

FIG. 1 is a cross-sectional view of active pillars of a vertical channel transistor according to the prior art.

FIGS. 2A to 2D are cross-sectional views describing a method for forming active pillars of vertical channel transistors according to an embodiment of the present invention.

DESCRIPTION OF SPECIFIC EMBODIMENTS

Other objects and advantages of the present invention can be understood by the following description, and become apparent with reference to the embodiments of the present invention. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Furthermore, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Embodiments of the invention are described hereafter with reference to the accompanying drawings.

The embodiments of the present invention, which will be described later, provide a method for forming an active pillar, sidewalls of which are profiled vertically, and overcoming a limitation of a photolithography process. For this purpose, the present invention adopts a principle that after a vertical etching process in which a substrate is etched to form the active pillar using a hard mask pattern as an etch barrier to a depth for the sidewalls to be profiled vertically even when by-product is generated thereon, a horizontal etching process is performed in such a manner that line width of the hard mask pattern and the active pillar are reduced at the same time when the by-product is removed. In addition, the present invention adopts another principle that a unit cycle defined as the vertical etching process and the horizontal etching process are each performed sequentially once is performed repeatedly at least two times or more.

Figure 2C:
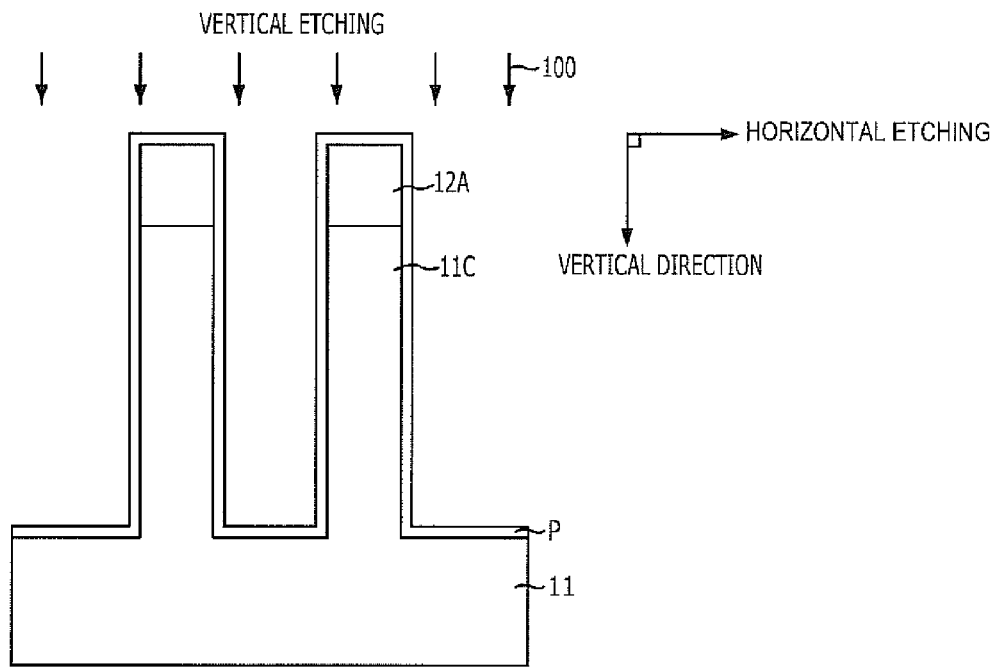
Figure 3A:
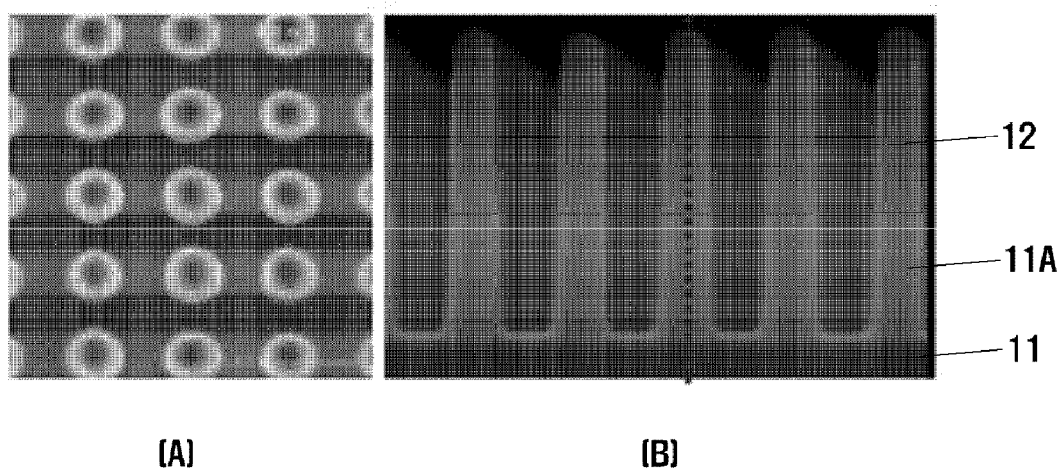
FIGS. 3A to 3D are images of the active pillars of the vertical channel transistors corresponding to FIGS. 2A to 2D according to the embodiment of the present invention wherein each [A] of FIGS. 3A to 3D is a plain image and each [B] of FIGS. 3A to 3D is a cross-sectional image.

As shown in FIGS. 2A and 3A, a hard mask pattern 12 is formed on a substrate 11 such as a silicon substrate. The hard mask pattern 12 acts as an etch barrier during an etching process for forming an active pillar and may be formed using a photolithography process.

The hard mask pattern 12 may be formed with any one or stacked layers thereof selected from a group consisting of an oxide layer, a nitride layer, an oxynitride layer and an amorphous carbon layer. As the oxide layer, $SiO_2$, Boron Phosphorus Silicate Glass (BPSG), Phosphorus Silicate Glass (PSG), Tetra Ethyl Ortho Silicate (TEOS), Un-doped Silicate Glass (USG), Spin On Glass (SOG), High Density Plasma (HDP), and Spin On Dielectric (SOD), etc. may be used. $Si_3N_4$ layer may be used as the nitride layer and SiON layer may be used as the oxynitride layer.

The method for forming the hard mask pattern 12 will be described below in detail as examples.

A buffer oxide layer (not shown) is formed on a substrate 11 and then, a nitride layer (not shown), an oxide layer (not shown), an amorphous carbon layer (not shown), a silicon oxynitride layer (not shown) and anti-reflection layer are stacked subsequently over the buffer oxide layer to form a stacked hard mask layer. Subsequently, the anti-reflection layer is coated with a photo resist and then an exposure process and a development process, that is, a photolithography process, are performed subsequently to form a photo resist pattern. Next, the anti-reflection layer and the silicon oxynitride layer are etched using the photo resist pattern as an etch barrier and then the amorphous carbon layer, the oxide layer, the nitride layer and the buffer oxide layer are etched subsequently using the photo resist pattern and the etched silicon oxynitirde layer as an etch barrier to form the hard mask pattern 12. At this time, the photo resist pattern, the anti-reflection layer and the silicon oxynitride layer may be all consumed and removed while the hard mask pattern 12 is formed.

Next, the substrate 11 is etched using the hard mask pattern 12 as an etch barrier to form an active pillar 11A sidewalls of which are profiled vertically. At this time, the etching may be performed anisotropically in order to form the active pillar 11A sidewalls of which are profiled vertically. Hereinafter, a process of anisotropically etching the substrate 11 by using the hard mask pattern 12 as an etch barrier will be referred to as a 'vertical etching 100.' The vertical etching 100 is an etch process where the etching in the vertical direction is performed more than the etching in the horizontal direction.

When the substrate 11 is a silicon substrate, the vertical etching 100 may be performed using $Cl_2$, HBr or a gas mixture thereof as a main etching gas. At this time, $O_2$ or inert gas may be added thereto to improve etching features such as an etching speed. Here, Ar gas or He gas, etc. may be used as the inert gas.

Meanwhile, the by-product P produced while the active pillar 11A is formed such as polymer may remain on the exposed surfaces of the substrate 11, the hard mask pattern 12 and the active pillar 11A. Accordingly, an etching depth of the vertical etching 100 may be adjusted to an extent that the sidewalls of the active pillar 11A are to be profiled vertically even when the by-product P is produced.

Figure 3B:
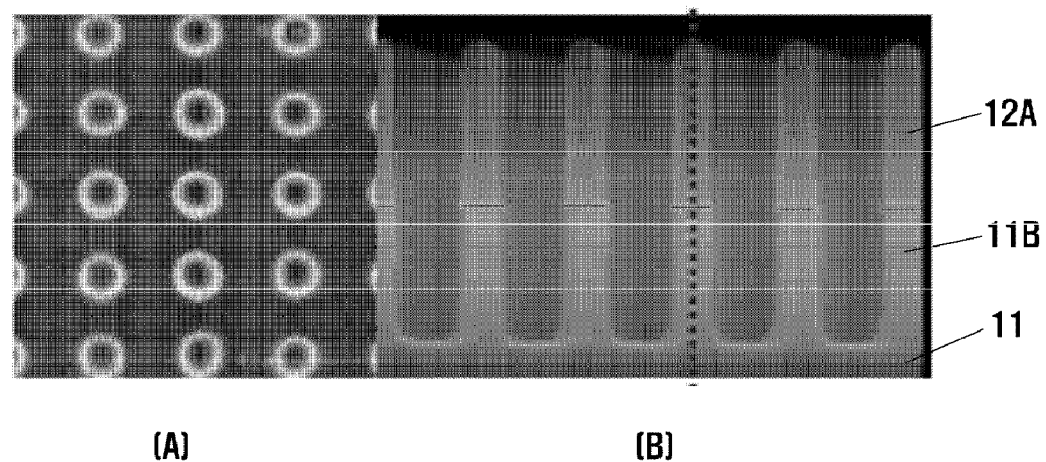

As shown in FIGS. 2B and 3B, an etching is performed isotropically in order to remove the by-product P remaining on exposed surfaces of the substrate 11, the hard mask pattern 12 and the active pillar 11A and at the same time to reduce uniformly the line width (or diameter) of the hard mask pattern 12 and the active pillar 11A. Hereinafter, the isotropic etching for removing the by-product P and while uniformly reducing the line width of the hard mask pattern 12 and the active pillar 11A will be referred to as 'horizontal etching 200' wherein the substrate is etched horizontally more than vertically. Here, reference numeral '12A' designates the hard mask pattern 12, the line width of which is reduced, and reference numeral '11B' designates the active pillar 11A, the line width of which is reduced.

When the horizontal etching 200 is performed, an etching gas used may have a fast etching speed for the by-product P in order to entirely remove the by-product P such as polymer and the same etching speed for the hard mask pattern 12A and the active pillar 11B in order to uniformly reduce the line width of the hard mask pattern 12A and the active pillar 11B. A gas mixture of fluoride carbon gas ($C_xF_y$), wherein x and y are natural numbers other than 0, and inert gases may be used as the etching gases. Here, the inert gas acts to generate plasma and the fluoride gas acts to remove the by-product P and at the same time to reduce the line width of the hard mask pattern 12A and the active pillar 11B. $CF_4$, $C_2F_6$, and $C_3F_8$, etc., may be used as the fluoride carbon gas.

The horizontal etching 200 will be described in detail below with examples.

The horizontal etching 200 is performed in such a manner that the gas mixture of $CF_4$ and Ar is injected at a total flow rate ranging from approximately 50 sccm (Standard Cubic Centimeters per Minute) to approximately 500 sccm into a plasma etching device such as Inductive Coupled Plasma (ICP), Electron Cyclotron Resonance (ECR), Microwave or Capacitively Coupled Plasma (CCP), and top power ranging from approximately 200 W to approximately 1,200 W is applied to form plasma, and then a bias power ranging from approximately 0 W to approximately 50 W is applied under a pressure ranging from approximately 10 mtorr (millitorr) to approximately 100 mtorr. Here, the top power acts to generate the plasma and when the bias power is 0 W, the bias power is not applied while the vertical etching 200 is performed.

Figure 3C:
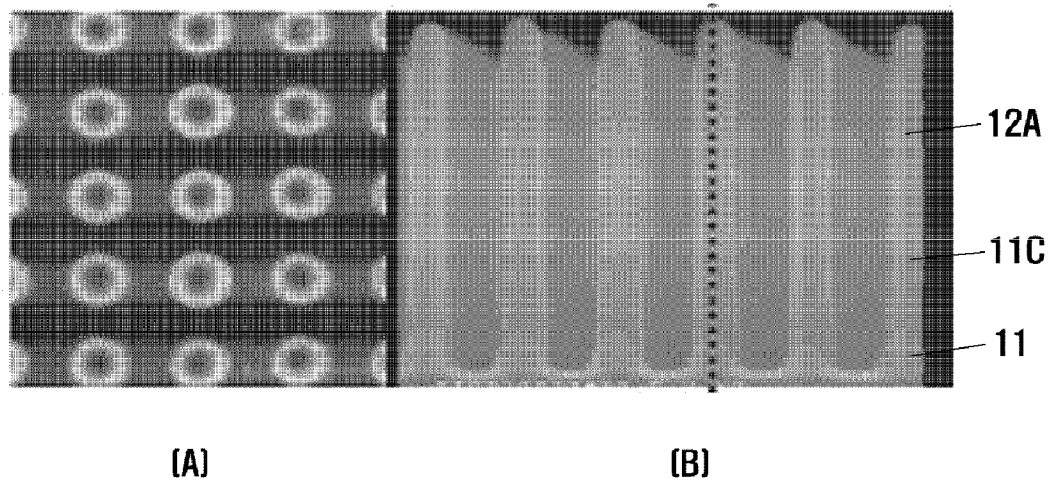

As shown in FIGS. 2C and 3C, the vertical etching is performed in such a manner that the substrate 11 is etched anisotropically using the hard mask pattern 12A as an etch barrier to extend length (or height) of the active pillar 11B, sidewalls of which are profiled vertically. Hereinafter, reference numeral '11C' designates the active pillar 11B, length of which is extended vertically.

When the substrate 11 is a silicon substrate, the vertical etching 100 may be performed using $Cl_2$, HBr or a gas mixture thereof as a main etching gas. At this time, $O_2$ or inert gas may be added thereto to improve etching features of the vertical etching 100. Here, Ar gas or He gas, etc. may be used as the inert gas.

Meanwhile, the by-product P produced while the active pillar 11C is formed such as polymer may remain on the exposed surfaces of the substrate 11, the hard mask pattern 12A and the active pillar 11C. Accordingly, an etching depth of the vertical etching 100 may be adjusted to an extent that the sidewalls of the active pillar 11C are to be profiled vertically even when the by-product P is produced.

Figure 2D:
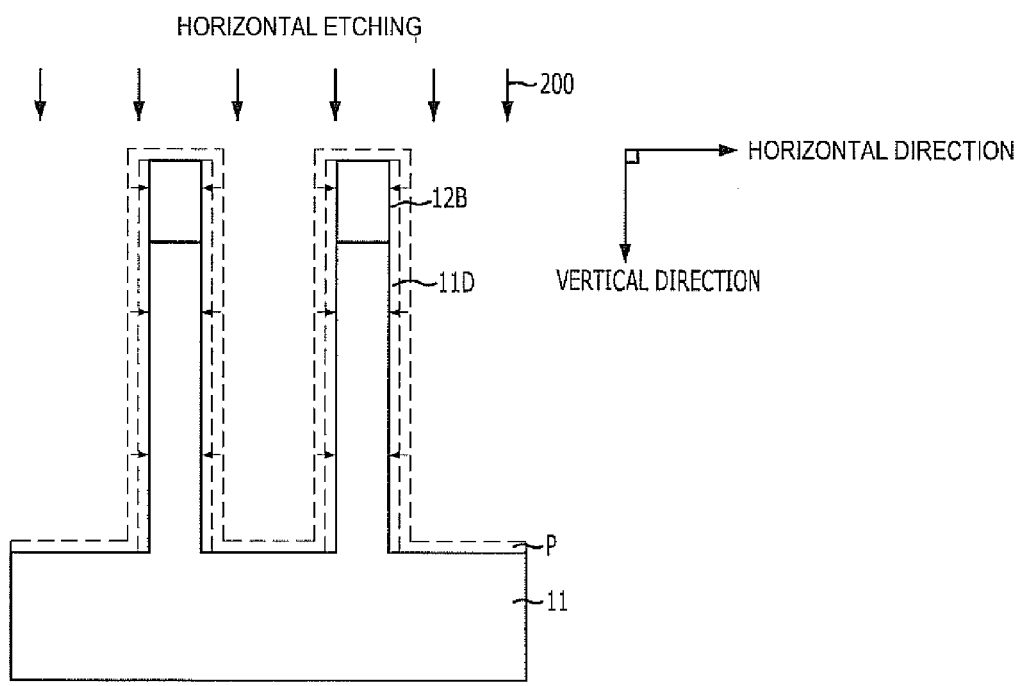
Figure 3D:
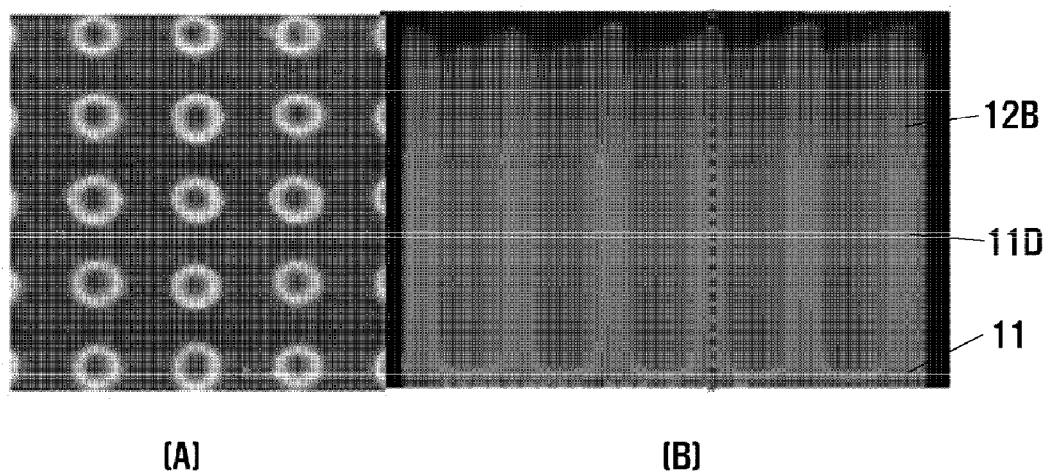

As shown in FIGS. 2D and 3D, the horizontal etching 200 is performed such that an etching is performed isotropically in order to remove the by-product P remaining on exposed surfaces of the substrate 11, the hard mask pattern 12A and the active pillar 11C and at the same time to reduce uniformly the line width (diameter) of the hard mask pattern 12A and the active pillar 11C. Hereinafter, reference numeral '12B' designates the hard mask pattern 12A, the line width of which is reduced, and reference numeral '11D' designates the active pillar 11C the line width of which is reduced.

When the horizontal etching 200 is performed, an etching gas, an etching speed of which for the by-product P is more rapid, may be used in order to entirely remove the by-product P such as polymer, where an etching gas etching speeds of the etching gas for the hard mask pattern 12B and the active pillar 11C are the same in order to uniformly reduce the line width of the hard mask pattern 12B and the active pillar 11C. A gas mixture of fluoride carbon gas of $(C_xF_y)$, where x and y are natural number other than 0, and inert gases may be used as aforementioned etching gases. Here, the inert gas acts to generate plasma and the fluoride gas acts to remove the by-product P and at the same time to reduce the line width of the hard mask pattern 12B and the active pillar 11C. $CF_4$, $C_2F_6$, and $C_3F_8$, etc., may be used as the fluoride carbon gas.

The horizontal etching 200 will be described in detail hereafter with examples. The horizontal etching 200 is performed in such a manner that the gas mixture of $CF_4$ and Ar, a total flow rate of which ranges from approximately 50 sccm to approximately 500 sccm is injected into a plasma etching device such as Inductive Coupled Plasma (ICP), Electron Cyclotron Resonance (ECR), Microwave or Capacitively Coupled Plasma (CCP), and top power ranging from approximately 200 W to approximately 1,200 W is applied to form plasma, and then a bias power ranging from approximately 0 W to approximately 50 W is applied under a pressure ranging from approximately 10 mtorr to approximately 100 mtorr. Here, the top power acts to generate the plasma, and when the bias power is 0 W, the bias power is not applied while the horizontal etching 200 is performed.

As aforementioned, according to the present invention, an active pillar is fabricated by repeatedly performing two or more times a unit cycle defined as the vertical etching 100 and performing the horizontal etching 200 subsequently, for example, once and thus the active pillar having vertical profiles on its sidewalls and having height and line width (or diameter) required in a highly integrated vertical channel transistor can be provided.

Additionally, according to the present invention, by-product P produced during the vertical etching 100 is removed by performing the horizontal etching 200 and thus problem caused from the by-product P, for example, a slope produced on sidewalls of the active pillar can be avoided.

Meanwhile, according to the present invention, the by-product P is removed and simultaneously line width of the hard mask pattern and the active pillar is reduced by performing the horizontal etching, thereby overcoming limitation of a photolithography process.

Finally, according to the present invention, since line width of the active pillar can be reduced through the horizontal etching 200, margin of a photolithography process for forming the hard mask pattern can be ensured.

While the present invention has been described with respect to the specific embodiments, it will be apparent to those skilled in the art that various changes and modifications may be made without departing from the spirit and scope of the invention as defined in the following claims.

What is claimed is:

1. A method for forming an active pillar of a vertical channel transistor, comprising:
    forming a hard mask pattern over a substrate;
    vertically etching the substrate using the hard mask pattern as an etch barrier to form the active pillar; and
    performing horizontal etching to remove by-product remaining on the exposed substrate, the hard mask pattern and the active pillar and at the same time to reduce line width of the hard mask pattern and the active pillar,
    wherein a unit cycle in which the vertical etching and the horizontal etching are each performed once is repeated at least two times or more.

2. The method of claim 1, wherein the vertical etching is performed anisotropically.

3. The method of claim 1, wherein the horizontal etching is performed isotropically.

4. The method of claim 1, wherein the vertical etching is performed using at least one of $Cl_2$, HBr and a gas mixture thereof as a main etching gas.

5. The method of claim 4, wherein the vertical etching is performed using $O_2$ or inert gas in addition to the main etching gas.

6. The method of claim 1, wherein the horizontal etching is performed using a gas mixture of fluoride gas and inert gas.

7. The method of claim 6, wherein the fluoride gas includes at least one of $CF_4$, $C_2F_6$, and $C_3F_8$.

8. The method of claim 6, wherein the horizontal etching is performed using the gas mixture at a flow rate of approximately 50 sccm to approximately 500 sccm.

9. The method of claim 1, wherein the horizontal etching is performed under a pressure ranging from approximately 10 mtorr to approximately 100 mtorr.

10. The method of claim 1, wherein the horizontal etching is performed using a top power ranging from approximately 200 W to approximately 1,200 W.

11. The method of claim 1, wherein the horizontal etching is performed using a bias power ranging from approximately 0 W to approximately 50 W.

12. A method for forming a pillar of a vertical channel transistor, comprising:
    forming a mask pattern over a substrate;
    vertically etching the substrate using the mask pattern as an etch barrier to form the pillar;
    horizontally etching the vertically etched substrate to horizontally remove by-product remaining on the exposed substrate, the mask pattern and the pillar and reduce horizontal width of the mask pattern and the pillar; and
    repeating a cycle of the vertical etching and horizontal etching at least once after completing a first cycle of the vertical etching and horizontal etching.

13. The method of claim 12, wherein the vertical etching is performed anisotropically.

14. The method of claim 12, wherein the horizontal etching is performed isotropically.

15. The method of claim 12, wherein the vertical etching is performed using at least one of $Cl_2$, HBr and a gas mixture thereof as a main etching gas.

16. The method of claim 15, wherein the vertical etching is performed using $O_2$ or inert gas in addition to the main etching gas.

17. The method of claim 1, wherein the by-product is formed over the active pillar during the vertical etching of the substrate and the performing of the horizontal etching includes removing the active pillar and the by-product formed over the active pillar.

18. The method of claim 12, wherein the by-product is formed over the pillar during the vertical etching of the substrate and the performing of the horizontal etching includes removing the pillar and the by-product formed over the pillar.

* * * * *